United States Patent [19]
Kihara

[11] Patent Number: 5,021,685
[45] Date of Patent: Jun. 4, 1991

[54] INPUT BUFFER CIRCUIT HAVING A RESISTOR FOR REDUCING THROUGH-CURRENT AND A CAPACITOR FOR PREVENTING DELAY

[75] Inventor: Yuji Kihara, Itami, Japan

[73] Assignee: Mitsubishi Denki Kabushika Kaisha, Tokyo, Japan

[21] Appl. No.: 508,460

[22] Filed: Apr. 13, 1990

[30] Foreign Application Priority Data

Apr. 17, 1989 [JP] Japan ................................ 1-98138

[51] Int. Cl.⁵ .................................................. H03K 17/14
[52] U.S. Cl. .................................... 307/443; 307/451; 307/475
[58] Field of Search ............... 307/448, 450, 443, 475, 307/451, 362, 481, 246

[56] References Cited

U.S. PATENT DOCUMENTS 4,697,110  9/1987  Masuda et al. ...................... 307/448
4,857,769  8/1989  Kotera et al. ....................... 307/448

FOREIGN PATENT DOCUMENTS 3006176  9/1981  Fed. Rep. of Germany.
62-19147  7/1987  Japan.

Primary Examiner—David Hudspeth
Assistant Examiner—Scott A. Ouellette
Attorney, Agent, or Firm—Lowe, Price, LeBlanc, Becker & Shur

[57] ABSTRACT

An input buffer for semiconductor integrated circuits has a resistor (16), capacitor (17) and a logical gate comprising transistors (11, 12, 13) connected in series between a supply line (61) and a ground line (62). The resistor (16) reduces the through current which flows toward the ground (Vss) when the logical gate switches. In a high speed operation, the capacitor (17) supplies current to the logical gate so that any delay which may possibly be caused by the provision of the resistor (16) can be prevented.

9 Claims, 6 Drawing Sheets

INPUT BUFFER CIRCUIT HAVING A RESISTOR FOR REDUCING THROUGH-CURRENT AND A CAPACITOR FOR PREVENTING DELAY

BACKGROUND OF THE INVENTION

1. Field of the Invention

The present invention relates generally to input buffer circuits for semiconductor integrated circuits, and more particularly, to an input buffer circuit having reduced current flow through the buffer when the level of input signal to the buffer changes.

2. Description of the Background Art

In order to constitute a circuit available for various uses such as in a computer system, many circuits provided in semiconductor chips are used. Terminals of the respective semiconductor chips are connected to each other through interconnection to constitute a circuit with the desired function. As examples of such integrated circuits provided in semiconductor chips, transistor-transistor logic (referred to as TTL hereinafter) circuits and metal oxide semiconductor (referred to as MOS hereinafter) circuits are known. Generally, TTL circuits employ bipolar transistors while MOS circuits employ MOS-type transistors which are a kind of field-effect transistor. The invention is directed to connecting these two types of transistors.

FIG. 6A is a circuit block diagram showing a semiconductor chip comprising MOS circuits 91 through 9n and 101 to which semiconductor chips 81 through 8n each including a TTL circuit are connected. The semiconductor chip 100 is connected to receive output signals from the externally provided TTL circuits 81 through 8n. The semiconductor chip (or semiconductor integrated circuit device) more specifically comprises input buffer circuits 91 through 9n each connected to receive an output signal from the corresponding one of the TTL circuits 81 through 8n, and an internal processing circuit 101 responsive to input signals for processing. The signals processed by the internal processing circuit 101 are outputted through output terminals.

FIG. 6B is a diagram showing the characteristics which are compatible with the TTL circuit. In a case where the TTL circuits and the MOS circuits are interconnected to each other as shown in FIG. 6A, it is required to adjust the differences between the two types of circuits in their operating current and voltage. The input circuits 91 through 9n are provided with such characteristics as compatible with the TTL circuit so as to adjust the differences. That is, as shown in FIG. 6B, the input buffers 91 to 9n detect logical "1" when an input signal having a voltage higher than the threshold voltage Vth1 is applied, and detect logical "0" when an input signal having a voltage lower than the threshold voltage Vth1 is applied. When the supply voltage Vcc is 5.0 volt, for example, the threshold voltage Vth1 is about 1.5 volt.

FIG. 6C is a logic state diagram which defines logical level of general MOS circuits. When the supply voltage of Vcc=5.0 volt is applied, the MOS circuits generally determine logical "1" or "0" depending on whether or not an input signal has a voltage higher than the threshold voltage Vth2 (=Vcc/2), or 2.5 volt in this case. That is, when an input signal of a voltage higher than 2.5 volt is applied, logical "1" is detected, and when an input signal of a voltage lower than 2.5 volt is applied, logical "0" is detected. Therefore, the input buffers 91 to 9n shown in FIG. 6A are provided to convert input signals received from the TTL circuits 81 to 8n into signals Vout which are acceptable to the internal processing circuit 101 constituted of an MOS circuit.

FIG. 7 is a circuit diagram of the conventional input buffer circuits 91 through 9n shown in FIG. 6A. Since the input buffer circuits 91 through 9n are equal to each other in their circuit structure, a somewhat detailed description is given only to the input buffer circuit 91 in the diagram. Referring to FIG. 7, the input buffer circuit 91 comprises PMOS transistors 11, 12 and an NMOS transistor 13 which are connected in series between a power supply line 61 and a ground line 62. The gates of the respective transistors 12 and 13 are connected together to receive an input signal Vin. Another NMOS transistor 14 is connected between a connection node (referred to as output node No hereinafter) of the transistors 12 and 13 and the ground line 62. The gates of the transistor 11 and the transistor 14 are connected together to receive a signal S. The signal S includes, for example, a chip select signal CS. Therefore, the transistors 11 through 14 constitute an NOR circuit. In the following, however, since a description will be made on a case where a low level signal S is applied, the circuit comprising the transistors 11 through 14 can be regarded as an inverter. Between the node No and the ground line 62, there is further connected a capacitor 15 as indicated by broken line, which shows gate capacitance of the transistors connected in a subsequent stage contained, for example, in the internal processing circuitry and stray capacitance between the node No and the ground line 62. Resistances 21 and 22 represent inherent resistances in the wiring forming the circuit in the inverter.

In operation, one or the other of the transistors 12 and 13 is turned on in response to the input signal Vin to charge or discharge the capacitor 15. As a result, an inverted output signal Vout is developed.

FIG. 8 is a diagram showing the relation between the through current which flows through the input buffer 91 shown in FIG. 7 and the voltage of the input signal Vin, where 5.0 volts is applied as supply voltage Vcc. Since the input buffer 91 should have the characteristics compatible with the TTL circuit, the inverter comprising the transistors 12 and 13 is provided with such characteristics as shown in FIG. 6B. Therefore, the transistors 12 and 13 are substantially brought in the "ON" state when an input voltage Vin of approximately 1.5 volts is applied. Accordingly, the maximum through current Ip2 flows from the supply voltage Vcc toward the ground Vss through this inverter.

Meanwhile, in order to provide the input buffer 91 with the characteristics shown in FIG. 6B, it is designed in such a manner that the transistors 11 and 12 have smaller gate widths and the transistor 13 has a larger one. Accordingly, the transistors 11 and 12 have high on-resistances, while the transistor 13 has a low on-resistance. As a result, the logical level shown in FIG. 6B can be implemented.

FIG. 9 is a diagram for explaining that the supply voltage Vcc and the ground voltage Vss of the input buffer 91 fluctuate in response to the input voltage Vin, where the input voltage Vin varies from 0 to 5.0 volts. As shown in FIG. 8, the through current Ip of the input buffer circuit 91 attains the maximum value (Ip2) when the input voltage Vin of approximately 1.5 volts is applied so that this excessive current Ip2 causes a fall of the supply potential Vcc and a rise of the ground potential Vss. That is, the supply potential Vcc decreases by a potential V4 and the ground potential Vss increases by a potential V5. As a result, the logical threshold value of the inverter changes temporarily.

More specifically, the logic state of the TTL circuit shown in FIG. 10A changes to that shown in FIG. 10B. Referring to FIG. 10B, the supply potential temporarily changes from Vcc to Vcc' ($=Vcc-V4$), and the ground potential temporarily changes from Vss to Vss' ($=Vss+V5$). As a result, the logical threshold value temporarily changes from Vth1 to Vth1' ($=Vth1+V6$). A voltage difference V6 is caused by the fluctuation in the supply potential level and the ground potential level. The voltage difference V6 takes a value which meets the expression V11:V12=V21:V22 in FIGS. 10A and 10B.

Additionally, it is to be noted that the excessive current Ip2 appears as undesirable noise that has deleterious effects on the internal processing circuit 101. Furthermore, even the logical threshold values of circuits provided in the proximity of the input buffer 91 may change under the influence of such potential fluctuations.

FIG. 4 is a waveform chart showing, with respect to time, transition of the input voltage Vin and the output voltage Vout of the input buffer 91 shown in FIG. 7. As previously described, the input buffer 91 should have the characteristics shown in FIG. 6B so that it is set in such a manner that sum of the on-resistances of the transistors 11 and 12 is larger than that of the transistor 13 alone. Accordingly, it takes only a little time for the capacitor 15 to be discharged by the transistor 13 while it takes more for the same to be charged. As a result, as indicated by dotted line in FIG. 4, the output voltage Vout is delayed in rising. Consequently, it is to be understood that a high-speed operation of the semiconductor integrated circuit 100 is prevented by its own characteristics as shown in FIG. 6B.

SUMMARY OF THE INVENTION

An object of the present invention is to reduce the excessive through current which flows when the level of input signal changes in an input buffer circuit for semiconductor integrated circuits.

Another object of the present invention is to reduce the supply potential fluctuation which occurs when the level of input signal changes in an input buffer circuit for semiconductor integrated circuits.

Still another object of the present invention is to prevent the threshold value fluctuation of a logical gate circuit comprised in an input buffer circuit for semiconductor integrated circuits, which occurs when the level of input signal changes.

Another object of the present invention is to prevent generation of noise in an input buffer circuit for semiconductor integrated circuits when the level of input signal changes.

Still another object of the present invention is to enhance operating speed of an input buffer circuit for semiconductor integrated circuits.

Briefly stated, an input buffer circuit for semiconductor integrated circuits according to the present invention comprises a resistance and a logical gate circuitry connected in series between first and second supply potentials, and a capacitance connected between a connection node of the resistance and the logical gate circuitry, and the second supply potential. The time constant for charging the capacitance, which is defined by the resistance and capacitance, is set below a value defined by the operating cycle.

In operation, since the resistance is connected between the first and second supply potentials along with the logical gate circuitry, the through current generated when the logical gate circuitry switches will be reduced. Additionally, since the time constant determined according to the resistance and capacitance is set below a predetermined value, it is possible for the capacitance to feed supply voltage to the logical gate circuitry in place of the first supply potential in a high-speed operation. Therefore, operation of the logical gate circuitry is prevented from being delayed by the provision of the resistance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
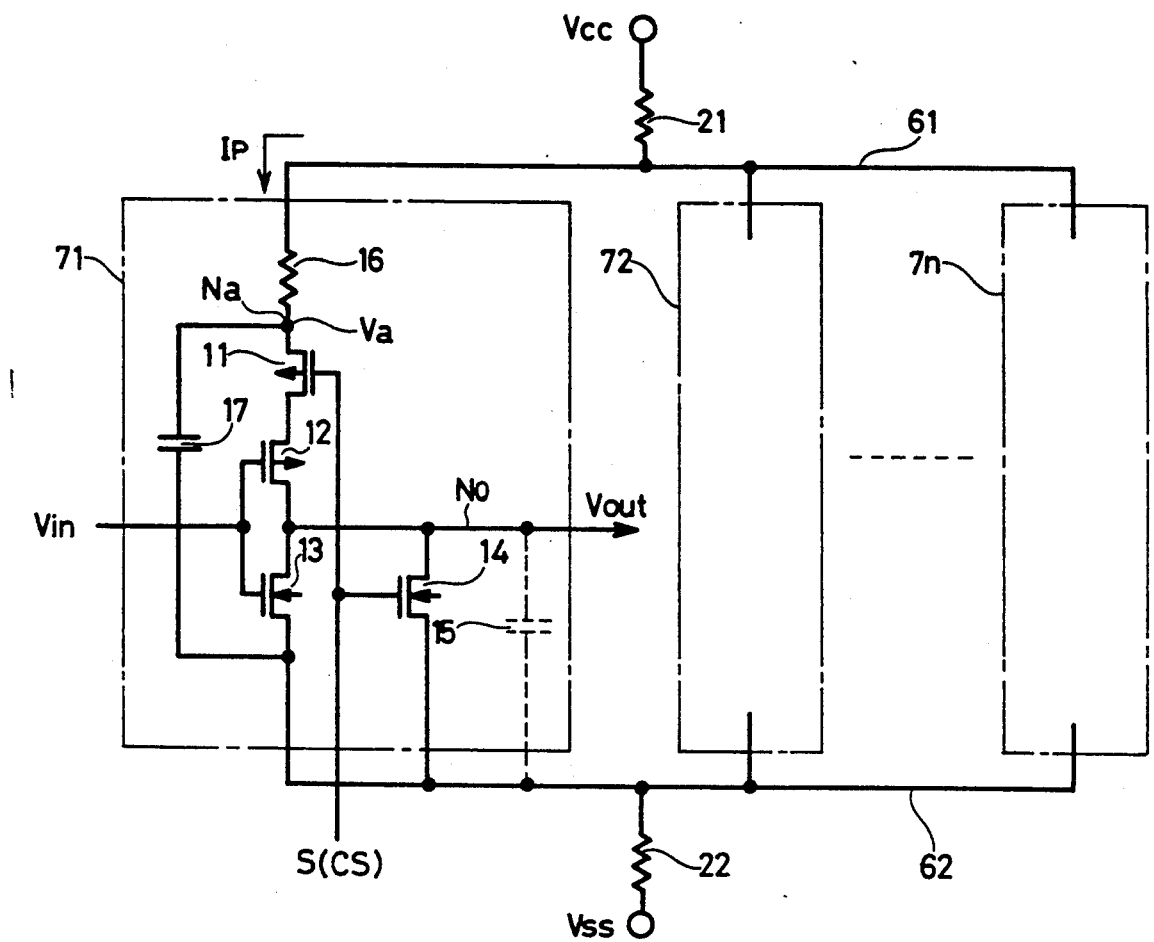
FIG. 1 is a circuit diagram of an input buffer according to an embodiment of the present invention.
Figure 6A:
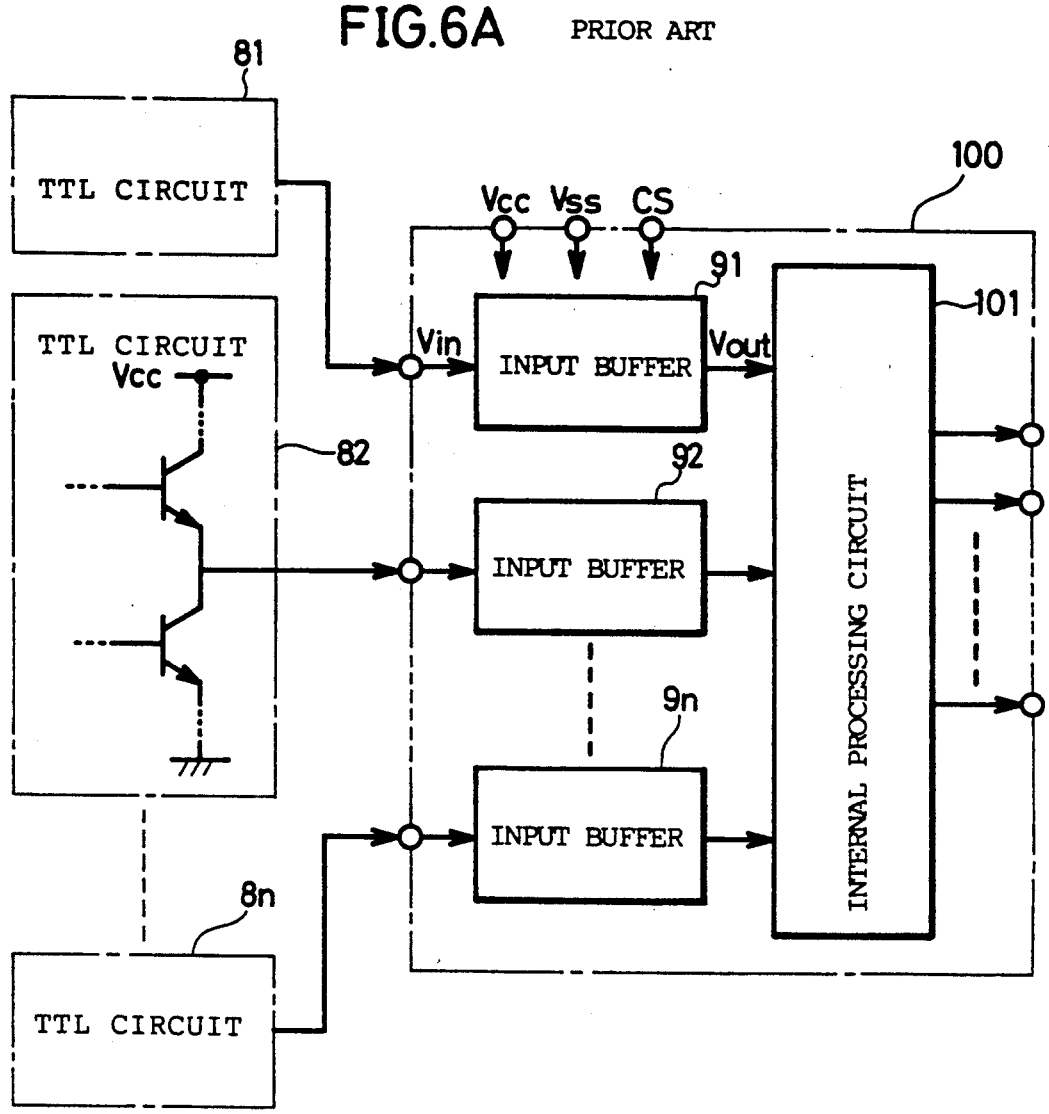
FIG. 6A is a circuit block diagram showing a semiconductor chip comprising MOS circuits which are connected to semiconductor chips comprising TTL circuits.
Figure 7:
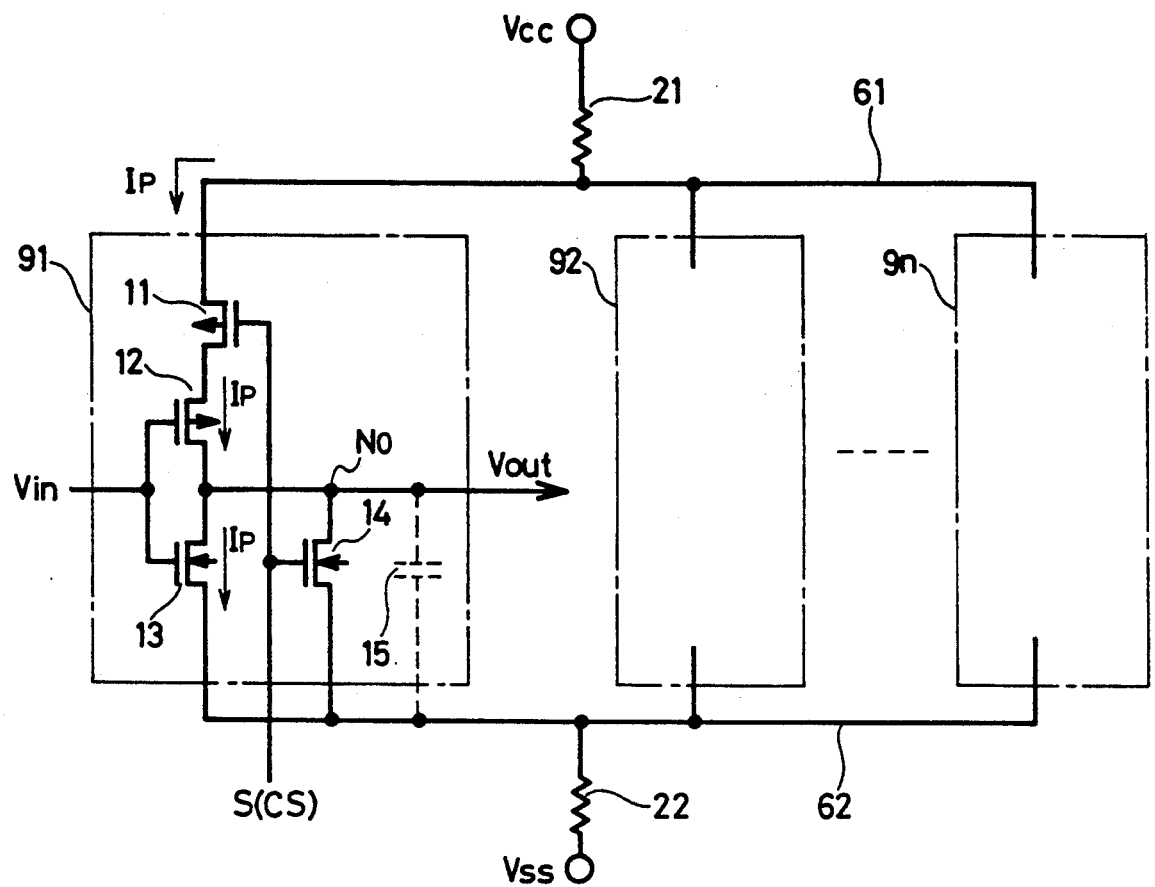
FIG. 7 is a circuit diagram of the conventional input buffer circuits shown in FIG. 6A.

The input buffers 71 through 7n shown in FIG. 1 are applicable in place of the circuits 91 through 9n in the semiconductor integrated circuit 100 shown in FIG. 6A. Referring to FIG. 1, what is different in the input buffer 71 from the input buffer 91 shown in FIG. 7 is as follows. That is, a resistor 16 is connected between the source of the PMOS transistor 11 and the supply line 61, and a capacitor 17 is connected between the source of the transistor 11 and the ground line 62. Therefore, the transistor 11, the resistor 16 and the capacitor 17 are connected together at a node Na.

Figure 2:
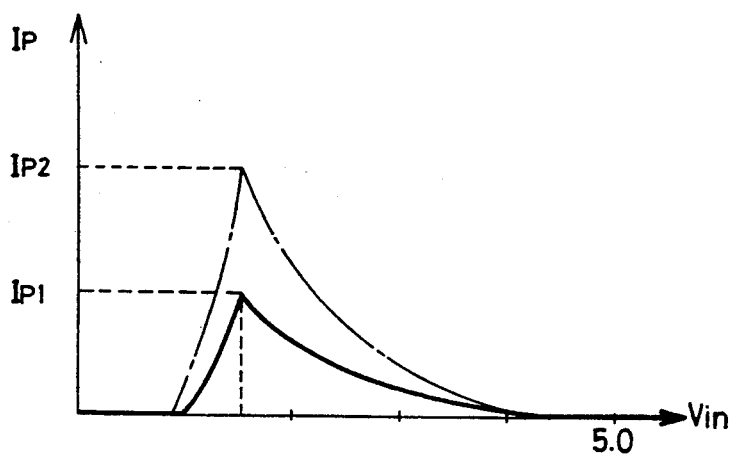
FIG. 2 is a diagram showing a relation between the through current which flows through the input buffer shown in FIG. 1 and the input voltage thereof.
Figure 3:
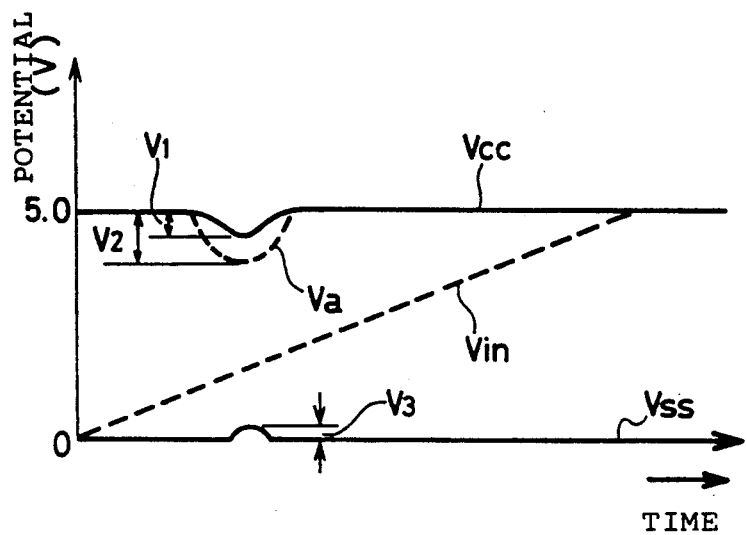
FIG. 3 is a diagram showing fluctuation in the supply potential and ground potential of the input buffer shown in FIG. 1.
Figure 6B:
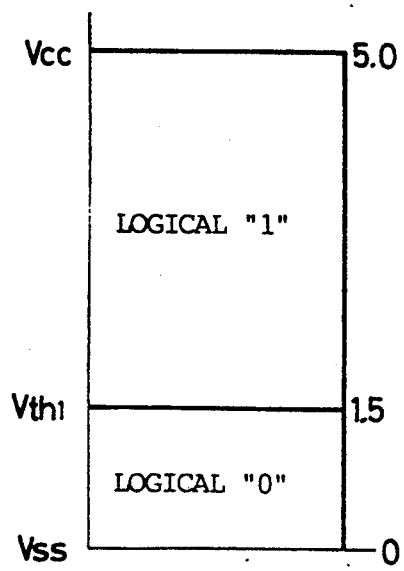
FIG. 6B is a logic state diagram showing characteristics of the TTL circuit.
Figure 6C:
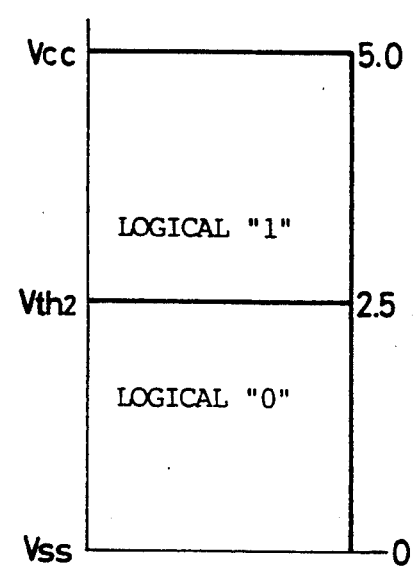
FIG. 6C is a logic state diagram showing characteristics of the MOS circuit.
Figure 8:
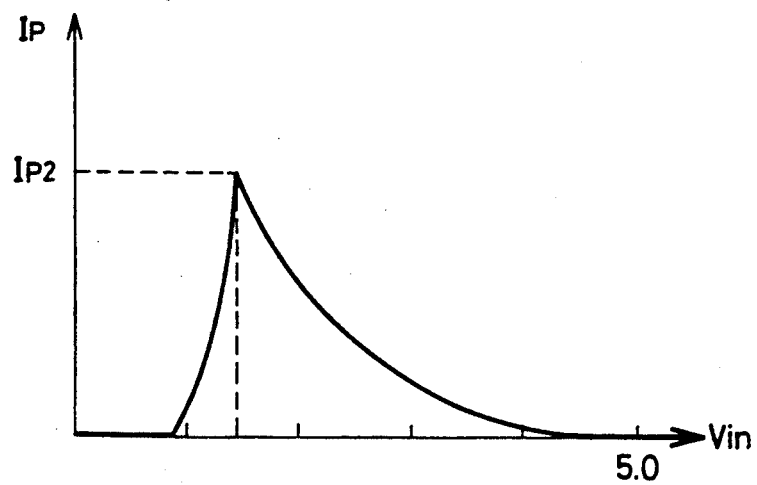
FIG. 8 is a diagram showing a relation between the through current which flows through the input buffer shown in FIG. 7 and the input voltage thereof.
Figure 9:
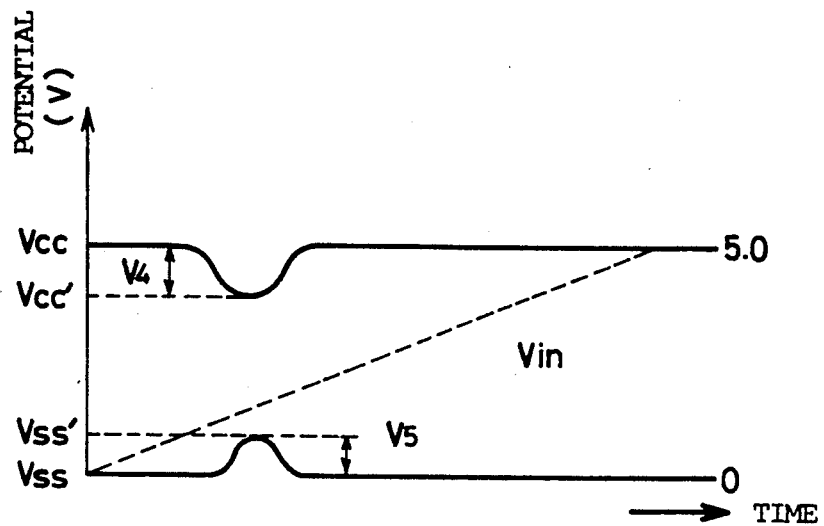
FIG. 9 is a diagram showing fluctuation in the supply potential and ground potential of the input buffer shown in FIG. 7.
Figure 10A:
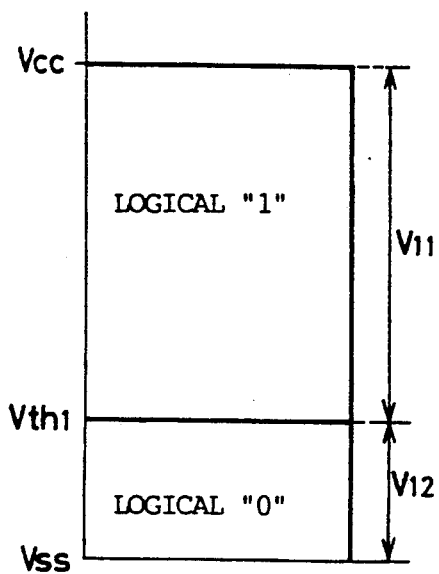
FIG. 10A is a logic state diagram showing characteristics of the TTL circuit, like FIG. 6B.
Figure 10B:
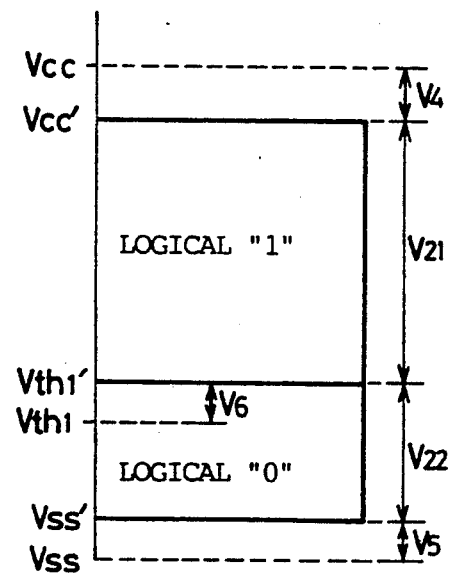
FIG. 10B is a logic state diagram showing characteristics of the TTL circuit that appear when the supply potential and the ground potential fluctuate.

Referring now to FIGS. 1 and 3, operation of the input buffer 71 will be described. The input buffer 71 shown in FIG. 1 receives a low level signal S on a constant basis so that it operates as an inverter like the circuit 91 shown in FIG. 7. More specifically, one or the other of the transistors 12 and 13 is turned on in response to an input voltage Vin, and an inverted output voltage Vout is developed. When the input voltage Vin is approximately 1.5 volts, there can be seen a tendency for the through current Ip to flow from the supply potential Vcc toward the ground potential Vss as in the circuit shown in FIG. 7. However, since the resistor 16 is provided in the circuit, influx of the through current Ip into the input buffer 71 is inhibited. Accordingly, as shown in FIG. 2, there flows the through current Ip having a peak value Ip1 much less than the value Ip2 in FIG. 8. Additionally, the resistor 16 is connected to the supply line 61 so that when the through current flows, the fluctuation in voltage occurs mostly at the node Na. This can be seen in FIG. 3. That is, while the potential Va at the node Na decreases by a potential V2, the supply potential Vcc decreases only by a potential V1 which is much less than the potential V2. Furthermore, since the through current is reduced, the rise of the ground potential Vss remains at a small value V3. The fluctuations in the supply potential Vcc and the ground potential Vss are small in comparison with the fluctuation values V4 and V5 shown in FIG. 9, so that the fluctuation in the threshold value voltage of the input buffer 71 is prevented all the more and the operation margin is ensured. In other words, it is further ensured that the characteristics compatible with the TTL circuit as shown in FIG. 6B can be obtained.

In addition to the foregoing, the fact that the input buffer 71 shown in FIG. 1 has been improved in the operating speed will be described below. First, a description will be made of a case where the input voltage Vin changes at a high speed. In this case, the time length in which all of the transistors 11 to 13 are simultaneously turned on is very short. Meanwhile, the capacitor 17 is charged through the resistor 16 in advance. Therefore, the current to be consumed by the transistors 11 to 13 will be supplied by the capacitor 17. Since the consumption current for the transistors 11 to 13 is not supplied by the supply potential Vcc through the resistor 16, any delay attributable to the provision of the resistor 16 can be prevented. Additionally, the capacitor 17 supplies the consumption current so that there occurs no fluctuation in the supply potential Vcc even though excessive current flows through the transistors 11 to 13 at a time.

Secondly, another case in which the input voltage Vin changes slowly will be described. In this case, the capacitor 17 cannot supply sufficient current to flow through the transistors 11 to 13. Accordingly, the consumption current is mostly supplied from the supply potential Vcc through the resistor 16 so that operation of the input buffer 71 will be delayed. When the input voltage Vin slowly changes as in this case, however, the input buffer 71 is rarely required to operate at a high speed, and the resistor 16 can reduce the through current with enough effect.

Furthermore, as described above, since the resistor 16 shown in FIG. 1 can reduce the through current Ip, it is possible to select larger gate widths for the transistors 11 to 13 in FIG. 1 than those in FIG. 7 within the possible range thereof. When the gate widths of the transistors 11 and 12 are set to be of larger sizes, the on resistance thereof will be reduced. Accordingly, charging of the output node No can be performed by the capacitor 17 through the transistors 11 and 12 at a higher speed. An increased gate width of transistor 13 contributes to stabilization of threshold voltage, permitting a greater tolerance of gate length variation in the manufacturing process.

Figure 4:
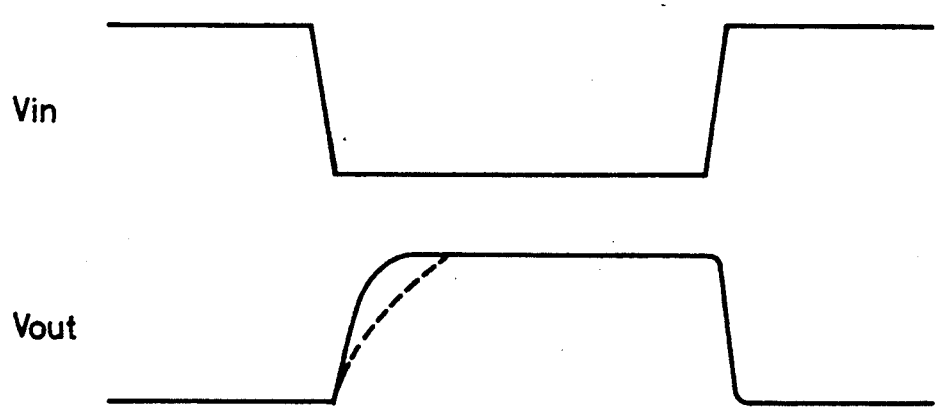
FIG. 4 is a waveform chart showing, with respect to time, transition of the input voltage and output voltage of the input buffer shown in FIGS. 1 and 7.

FIG. 4 is a waveform chart showing transition of the input voltage Vin and the output voltage Vout of the input buffer 71 shown in FIG. 1 with respect to time. When the gate widths of the transistors 11 to 13 are set to be of larger sizes, charging of the node No is facilitated as described above. Therefore, as shown in FIG. 4, the output voltage Vout rises more rapidly than that of the conventional circuit 91 as indicated by dotted line. Consequently, the input buffer 71 shown in FIG. 1 can be applied to a semiconductor integrated circuit operating at a higher speed.

Figure 5A:
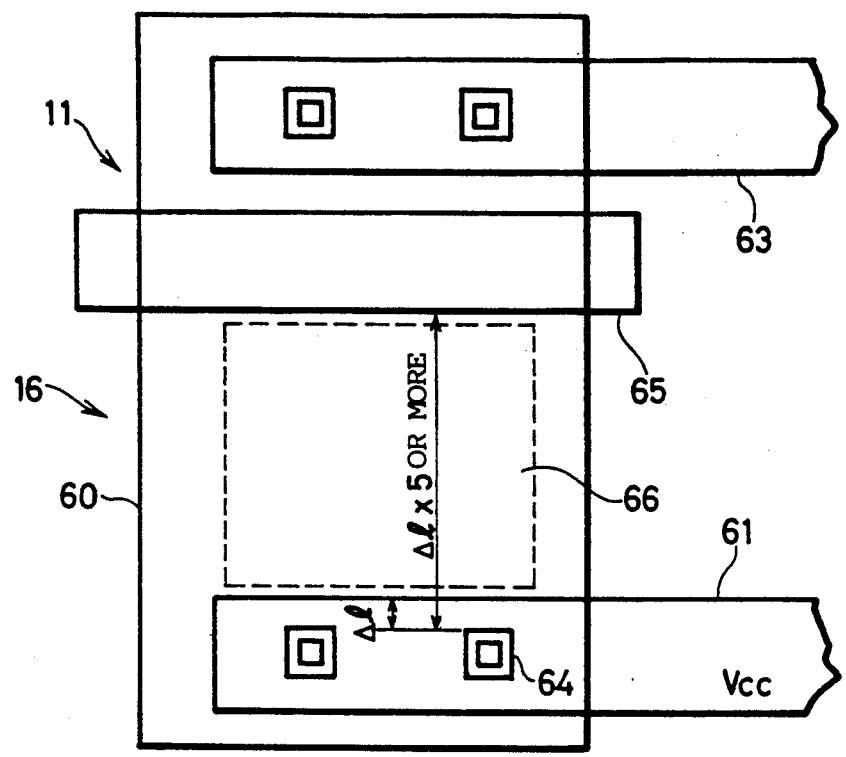
FIG. 5A is a plan view of a semiconductor substrate showing an example in which the resistance 16 shown in FIG. 1 is formed.

FIG. 5 is a plan view of a semiconductor substrate showing a preferred embodiment to form the resistor 16 shown in FIG. 1. In FIG. 5, there are shown the PMOS transistor 11 and the resistor 16. The source and drain of the transistor 11 are formed in a field region 60 in the semiconductor substrate. The gate of the transistor 11 is formed of polysilicon 65. The resistor 16 is formed in a resistance region (field region) 66 in the semiconductor substrate. One end of the resistance region 66 is connected to a metallic interconnection 61 having supply potential Vcc through a contact hole 64. This results in that the source of the transistor 11 is connected to the interconnection 61 through the resistance region 66. The drain of the transistor 11 is connected to a metallic interconnection 63. In order to obtain the desired value of the resistor 16, the length between the contact 64 and the gate 65 should be set to be $\Delta l \times 5$ or more when $\Delta l$ represents the shortest length between the contact and the gate.

As another way to form the resistor 16, it is also possible to use an interconnection of polysilicon instead of the resistance region 66 as shown in FIG. 5 so as to utilize the interconnection resistance thereof. Additionally, another field region other than the resistance region 66 can be utilized to form the resistor 16.

Figure 5B:
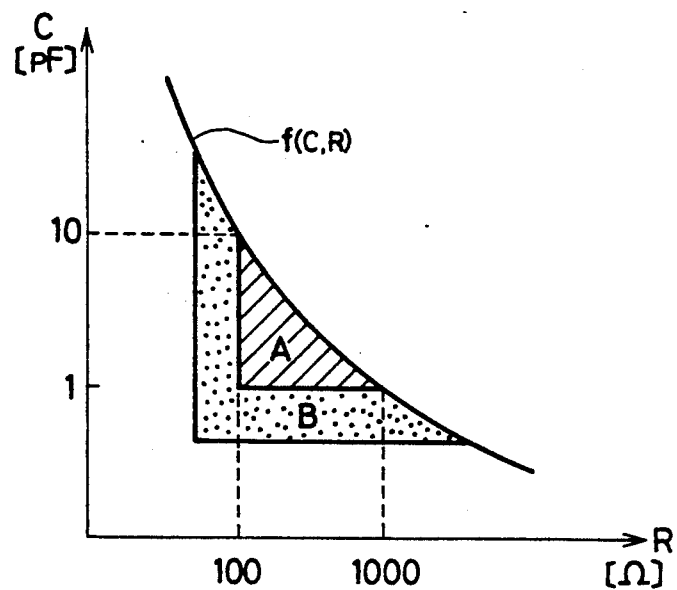
FIG. 5B is a diagram showing a range of the time constant required in the input buffer circuits shown in FIG. 1.

Referring to FIG. 5B, a desirable relation between the resister 16 and the capacitor 17 will be described below. Generally, a cycle time required of the MOS circuit is about 50 to 100 ns and not less than 10 ns even at its maximum speed. Therefore, value R of the resistor 16 and value C of the capacitor 17 is required to meet the following expression.

$$f(C, R) = C \cdot R < 10^{-8} \quad \ldots (1)$$

where $10^{-8} s = 10$ ns.

In practice, however, it is preferable to take the case into consideration where the cycle time is 1 ns so as to ensure a noise margin.

$$f(C, R) = C \cdot R < 10^{-9} \quad \ldots (2)$$

Since the sum of the on-resistances of the transistors 11, 12 and 13 which are connected between the node Na and the ground Vss shown in FIG. 1 is about 100 ohms, it is required to meet the expression (2) in order to effectively reduce the consumption power. Additionally, assuming now that value of the capacitance 15 is in a range between about 0.5 pF and 1.0 pF, in order to drive the capacitance 15 by charges in the capacitor 17, the capacitor 17 is to be set at least at 1.0 pF. Accordingly, it is preferable for the values R and C of the resistor 16 and the capacitor 17, respectively, to be taken within an area A shown in FIG. 5B. When the on-resistances of the transistors 11, 12 and 13 and the value of the capacitance 15 are not in the area described above, however, the values R and C may be set within an expanded area B shown in FIG. 5B.

As described in the foregoing, since in the input buffer circuit shown in FIG. 1, the resistor 16 is connected between the supply potential Vcc and the ground potential Vss along with the inverter, the through current which flows through the inverter when inversion is performed therein is reduced. Therefore, it is possible to prevent the supply potential from fluctuating so that the threshold value fluctuation of the inverter can also be prevented. This means that operation margin of the inverter is ensured. Additionally, since the time constant determined according to the resistor 16 and the capacitor 17 is set to be below a predetermined value, the capacitor 17 feeds supply voltage to the inverter in place of the supply potential Vcc in a high speed operation. Accordingly, any delay in operation attributable to the provision of the resistor 16 can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input buffer circuit for semiconductor integrated circuits which can operate in a predetermined operation cycle, comprising:
   resistance means and logical gate means connected in series between first supply potential and second supply potential,
   said logical gate means operating in response to an input signal; and
   capacitance means connected between a connection node of said resistance means and logical gate means, and said second supply potential,
   the time constant defined by said resistance means and capacitance means for charging said capacitance means being set to be below a value defined by said operation cycle.

2. The input buffer circuit for semiconductor integrated circuits according to claim 1, wherein the threshold value of said logical gate means is set to be a value closer to said second potential with respect to an intermediate value between said first and second supply potentials.

3. The input buffer circuit for semiconductor integrated circuits according to claim 2, wherein said logical gate means comprises first inverter means means.

4. The input buffer circuit for semiconductor integrated circuits according to claim 2, wherein the threshold value of said logical gate means is compatible with a logical level of an externally provided transistor-transistor logic circuit.

5. The input buffer circuit for semiconductor integrated circuits according to claim 2, wherein said logical gate means comprises NOR gate means.

6. The input buffer circuit for semiconductor integrated circuits according to claim 3, wherein said first inverter means comprises:
   first field effect device of one conductivity type having a control electrode and second field effect device of the opposite conductivity type having a control electrode which are connected in series between the first and second supply potentials,
   the control electrodes of said first and second field effect devices being connected together to receive the input signal.

7. The input buffer circuit for semiconductor integrated circuits according to claim 5, wherein said NOR gate means comprises:
   third field effect device of one conductivity type having a control electrode; and
   second inverter means connected with said third field effect device in series between the first and second supply potentials,
   said third field effect device having the control electrode connected to receive a control signal for externally controlling said input buffer circuit, and
   said second inverter means having an input node connected to receive the input signal.

8. The input buffer circuit for semiconductor integrated circuits according to claim 1, wherein said predetermined value defined by said operating cycle comprises $10^{-8}$ sec.

9. The input buffer circuit for semiconductor integrated circuits according to claim 6, wherein
   said field effect device of one conductivity type includes a p-type field effect device, and
   said field effect device of the opposite conductivity type includes an n-type field effect device.

* * * * *